(12) United States Patent
Kishida et al.

(10) Patent No.: US 9,560,761 B2
(45) Date of Patent: Jan. 31, 2017

(54) CURVED DISPLAY

(71) Applicant: LG Display Co., Ltd., Seoul (KR)

(72) Inventors: Katsuhiko Kishida, Kawasaki (JP);
Hongsik Kim, Goyang-si (KR);
Seunghwan Shin, Jeonju-si (KR);
Chimyung Ahn, Paju-si (KR);
Daeyoung Seo, Incheon (KR)

(73) Assignee: LG Display Co., Ltd., Seoul (KR)

(*) Notice: Subject to any disclaimer, the term of this patent is extended or adjusted under 35 U.S.C. 154(b) by 83 days.

(21) Appl. No.: 14/577,946

(22) Filed: Dec. 19, 2014

(65) Prior Publication Data
US 2015/0189768 A1 Jul. 2, 2015

(30) Foreign Application Priority Data
Dec. 31, 2013 (KR) .................. 10-2013-0169311

(51) Int. Cl.
*H05K 1/14* (2006.01)
*H05K 1/02* (2006.01)
*H05K 1/18* (2006.01)

(52) U.S. Cl.
CPC .............. *H05K 1/147* (2013.01); *H05K 1/028* (2013.01); *H05K 1/189* (2013.01); *H05K 2201/09063* (2013.01); *H05K 2201/10136* (2013.01); *H05K 2201/10681* (2013.01)

(58) Field of Classification Search
CPC ...... H01L 27/3026; H05K 1/028; H05K 1/147
See application file for complete search history.

(56) References Cited

U.S. PATENT DOCUMENTS

| 5,061,830 | A | * | 10/1991 | Ambrose | H01H 13/702 200/5 A |
|---|---|---|---|---|---|
| 6,710,838 | B2 | * | 3/2004 | Sakaki | G02F 1/13452 345/102 |
| 7,529,100 | B2 | * | 5/2009 | Chuang | H05K 1/028 174/254 |
| 7,746,439 | B2 | * | 6/2010 | Kohno | G02F 1/13452 349/150 |
| 7,948,763 | B2 | * | 5/2011 | Chuang | H05K 1/028 174/254 |
| 9,030,826 | B2 | * | 5/2015 | Kim | H01L 23/36 257/712 |
| 9,084,368 | B2 | * | 7/2015 | Tsai | G06F 1/1626 |
| 2013/0106807 | A1 | * | 5/2013 | Lin | H04N 13/0404 345/204 |
| 2013/0155655 | A1 | * | 6/2013 | Lee | H05K 5/03 362/97.1 |
| 2014/0320779 | A1 | * | 10/2014 | Noumi | G02F 1/13452 349/58 |
| 2015/0173171 | A1 | * | 6/2015 | Kim | H05K 1/028 361/749 |
| 2015/0189755 | A1 | * | 7/2015 | Choi | H05K 1/028 361/749 |

(Continued)

*Primary Examiner* — Jeremy C Norris
*Assistant Examiner* — Nathan Milakovich
(74) *Attorney, Agent, or Firm* — Fenwick & West LLP

(57) ABSTRACT

Embodiment related to a curved display including a curved panel, a printed circuit board separated from the curved panel, and a plurality of flexible films electrically connecting the curved panel and the printed circuit board. The lengths of the flexible films is increased as the flexible films approach an edge of the curved panel.

8 Claims, 9 Drawing Sheets

(56) References Cited

U.S. PATENT DOCUMENTS

| | | | |
|---|---|---|---|
| 2015/0208522 A1* | 7/2015 | Kim | H05K 1/028 361/749 |
| 2015/0245488 A1* | 8/2015 | Jang | G06F 1/16 361/749 |
| 2015/0316810 A1* | 11/2015 | Shibahara | G02F 1/1333 349/150 |
| 2015/0373828 A1* | 12/2015 | Ye | G02F 1/13454 349/43 |
| 2016/0028047 A1* | 1/2016 | Park | H01M 2/0202 429/7 |
| 2016/0066410 A1* | 3/2016 | Cho | H05K 1/028 361/749 |
| 2016/0088726 A1* | 3/2016 | Jeon | H05K 1/0283 361/749 |
| 2016/0093685 A1* | 3/2016 | Kwon | H01L 27/3276 257/40 |
| 2016/0165726 A1* | 6/2016 | Lee | H05K 1/142 361/749 |
| 2016/0198560 A1* | 7/2016 | Shin | H05K 1/028 362/600 |

* cited by examiner

Fig. 3
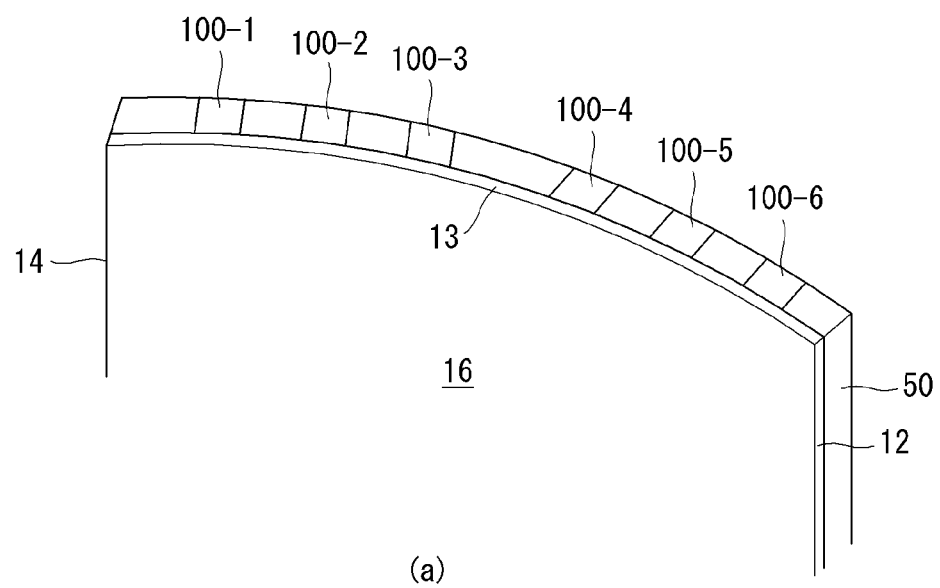
(a)
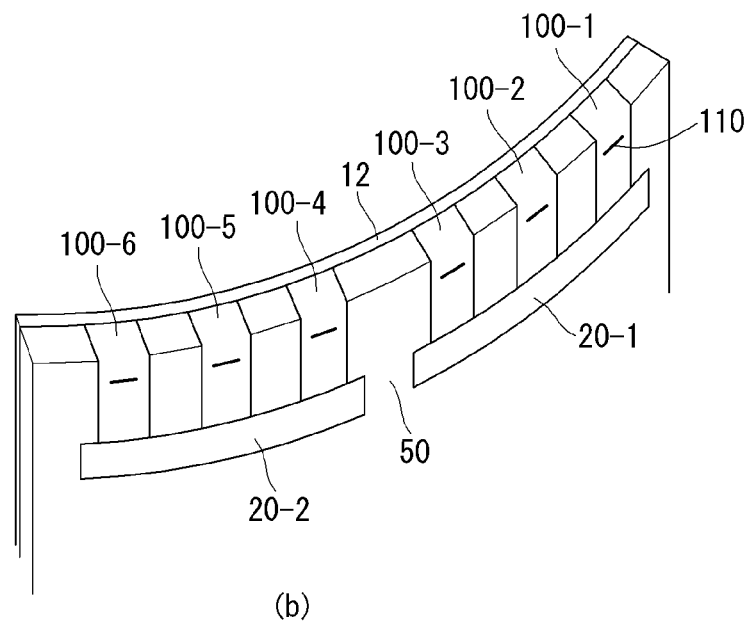
(b)

Fig. 4
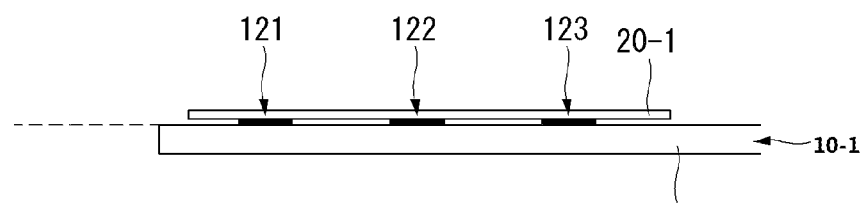
(a)
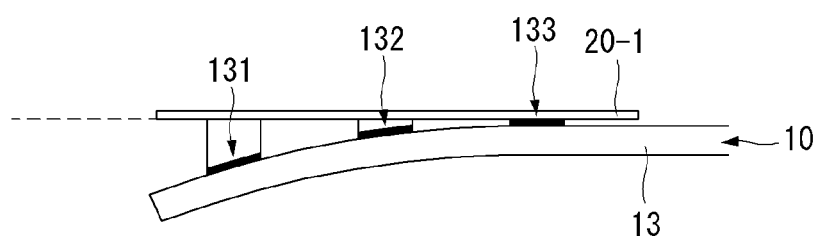
(b)

CURVED DISPLAY

CROSS REFERENCE TO RELATED APPLICATION

This application claims the priority under 35 U.S.C. §119(a) to Korean Patent Application No. 10-2013-0169311 filed on Dec. 31, 2013, which is incorporated herein by reference for all purposes as if fully set forth herein.

BACKGROUND OF THE INVENTION

Field of the Invention
The present invention relates to a curved display.
Discussion of the Related Art
In the field of display devices, a slim, lightweight, and large-scaled flat panel display (FPD) has been rapidly replaced a cathode ray tube (CRT) that tends to be heavy and bulky. Examples of the flat panel display include a liquid crystal display (LCD), a plasma display panel (PDP), an organic light emitting diode (OLED) display, and an electrophoretic display (EPD).

Generally, a flat panel display includes a module where a polarizer and an optical film are attached to a display panel, and a case top supporting and covering the module. The display panel or the polarizer shrinks or expands according to an external environment, and thus a shape of the panel may be changed. When the panel is deformed, an internal liquid crystal layer is deformed to twist an optical axis of the panel. Accordingly, a light leakage may occur. Particularly, a curved display using a curved panel formed by artificially bending the panel has a noticeable problem of the light leakage due to tension of a chip-on film bonding the curved panel and a printed circuit board.

SUMMARY

Embodiments relate to a curved display including a curved panel, a printed circuit board and a plurality of flexible films. The printed circuit board is separate from the curved panel. The plurality of flexible films electrically connect the curved panel and the printed circuit board. The distance between the curved panel and the printed circuit board increases toward an edge of the curved panel.

In one or more embodiments, a length of a flexible film closer to an edge of the curved panel is longer than a length of another flexible film further away from the edge.

In one or more embodiments, the printed circuit board includes a first printed circuit board disposed at one side of a surface of the curved panel, and a second printed circuit board disposed at another side of the surface of the curved panel.

In one or more embodiment, an angle between the first printed circuit board and the curved panel and an angle between the second printed circuit board and the curved panel correspond to a curvature angle of the curved panel.

In one or more embodiment, at least one of a horizontal slit, a vertical slit, and a diagonal slit is formed in each of the flexible films.

In one or more embodiment, each of the flexible films has at least one lateral side that is indented inwardly at a region not bonded to the curved panel or the printed circuit board.

Embodiments also relate to a display device including a curved display panel, a first printed circuit board, a first flexible film and a second flexible film. The curved display panel is formed with a pixel array and includes a curved first surface and a curved second surface opposed to the first curved surface. The first, the curved first surface defined by a first lateral edge, a second lateral edge, a first curved line connecting one end of the first lateral edge and one end of the second lateral edge, and a second curved line connecting another end of the first lateral edge and another end of the second lateral edge. The first printed circuit board is separate from the curved display panel. The first flexible film is secured to a first region of the first curved surface and the first printed circuit board to electrically connect the curved display panel to the first printed circuit board. The first region is closer to the first lateral edge than the second lateral edge. The first flexible film extends around the first curved line along a first curved path of a first length. The second flexible film is secured to a second region of the first curved surface and the first printed circuit board. The second region is closer to the first lateral edge than the first region. The second flexible film extends around the first curved line along a second curved path of a second length longer than the first length.

In one or more embodiments, an integrated circuit is mounted on each of the first and second flexible films.

In one or more embodiments, the first curved line is a first arc and the second curved line is a second arc, the first and the second arcs having a same radius of curvature.

In one or more embodiments, a ratio of the first length relative to a distance from a center of the first arc to the first region is same as a ratio of the second length relative to a distance from the center of the first arc to the second region.

In one or more embodiments, the ratio of the first length relative to the distance from the center of the first arc to the first region corresponds to tan(φ) where φ represents the radius of curvature.

In one or more embodiments, the first and second flexible films have a same length but attached to the first printed circuit board at different longitudinal locations.

In one or more embodiments, the first and second flexible films have different lengths.

In one or more embodiments, the display device further includes a second printed circuit board, a third flexible film, and a fourth flexible film. The second printed circuit board is separate from the curved display panel and the first printed circuit board. The third flexible film is secured to a third region of the first curved surface and the second printed circuit board to electrically connect the curved display panel to the second printed circuit board, the third region closer to the second lateral edge than the first lateral edge. The third flexible film extends around the first curved line along a third curved path of a third length. The fourth flexible film is secured to a fourth region of the first curved surface and the second printed circuit board. The fourth region is closer to the second lateral edge than the third region. The fourth flexible film extends around the first curved line along a fourth curved path of a fourth length longer than the third length.

In one or more embodiments, each of the first and second flexible films is rectangular in shape with one or more slits to increase flexibility.

In one or more embodiments, each of the first and second flexible films is mounted with an integrated circuit and lateral sides of each of the first and second flexible films is indented towards the integrated circuits.

BRIEF DESCRIPTION OF THE DRAWINGS

The accompanying drawings illustrate embodiments of the invention and together with the description serve to explain the principles of the invention. In the drawings:

FIG. 3 is a diagram illustrating chip-on films (COF) connecting the curved display panel and printed circuit boards mounted to a backlight unit, according to one embodiment.

FIGS. 4(a) and 4(b) are diagrams illustrating surfaces of COFs attached to a flat panel and curved panel, respectively.

DETAILED DESCRIPTION

Reference will now be made in detail to embodiments of the invention, examples of which are illustrated in the accompanying drawings. Wherever possible, the same reference numbers will be used throughout the drawings to refer to the same or like parts. Detailed description of well-known components is omitted herein to avoid obfuscation.

Although embodiments are described below with reference to curved liquid crystal display (LCD) panels, the same principle can be applied to display panels for use in devices such as an organic light emitting diode (OLED) display, a field emission display (FED), a plasma display panel (PDP), and an electrophoresis display (EPD).

Figure 1:
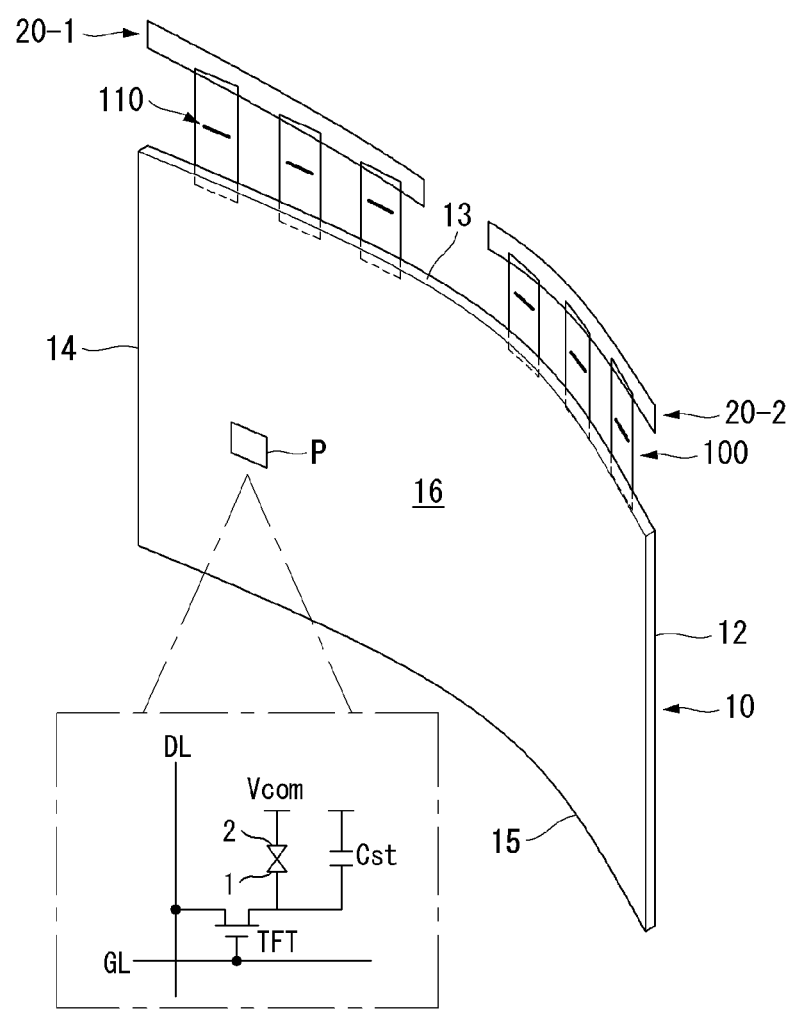
FIG. 1 is a perspective view of a curved display panel according to one embodiment.

FIG. 1 is a perspective view of a curved display panel 10, according to one embodiment. The curved display panel 10 includes a front curved surface 16, a rear curved surface 12, left and right surfaces, and bottom and top surfaces. The front curved surface 16 includes a right edge 12, a left edge 14, a curved top edge 13 and a curved bottom edge 15.

In the embodiments, the liquid crystal display may include, among other components, a curved panel 10, printed circuit boards 20-1 and 20-2 (hereinafter collectively referred to as "the printed circuit boards 20"), and chip-on films 100.

Different tension forces are applied to both sides of a chip-on film attached to a curved panel 10 and bent to surround curved panel 10. The reason for the different tension forces is that the curved panel 10 is bent but the chip-on film 100 is flat and has both sides that are parallel to each other. In such configuration, the light leakage is noticeable due to local stress caused by tension in the chip-on films 100. Particularly, since the chip-on films 100 are bent in an opposite direction to a bending direction of the curved panel 10, tension is increased at both sides of the curved panel 10. Accordingly, the light leakage is further noticeable in the chip-on film 100 positioned near the right or left edge of the curved panel 10. Further, since the chip-on film 100 is bent while being bonded to the curved panel 10 and the printed circuit board, stress is present in the chip-on film 100. The stress may affect the curved panel 10 or destroy a circuit pattern formed on the chip-on film 100.

The curved panel 10 includes a pixel array having pixels arranged in a matrix form to display input image data. The pixel array includes a thin film transistor (TFT) array formed on a lower substrate, a color filter array formed on an upper substrate, and liquid crystal cells formed between the lower substrate and the upper substrate. Each pixel may include, for example, a data line DL, a gate line (or scan lines) GL intersecting the data line DL, a TFTs formed at the intersection of the data line DL and the gate line GL, a pixel electrode 1 and a storage capacitor Cst connected to the TFT.

The printed circuit boards 20 may be mounted, for example, with timing controllers (not shown) and power modules (not shown). The timing controller receives signals such as digital video data, and timing signals such as a vertical synchronizing signal Vsync, a horizontal synchronizing signal Hsync, a data enable signal DE, and a main clock CLK from an external host system. The timing controller transfers the digital video data to a source drive IC 110. The timing controller also generates a source timing control signal for controlling operation timing of source drive ICs, and gate timing control signals ST, GCLK, and MCLK for controlling operation timing of a level shifter and a shift register of a gate driving circuit (not shown) by using the timing signals Vsync, Hsync, DE, and CLK.

The power module is operated when an input voltage supplied from the host system is a UVLO level or more, and generates an output after a predetermined time is delayed. The output of the power module includes VGH, VGL, VCC, VDD, HVDD, RST, and the like.

The source drive IC 110 receives the source timing control signal to generate analog signals transmitted over the data line (DL) to control the TFTs in the pixels P of the pixel array.

COFs 100 connect the curved panel 10 and the first printed circuit boards 20. The source drive IC 110 is mounted on each of COFs 100. The gate driving circuit may be mounted in the form of gate driver integrated circuits (ICs) on COFs 100, or may be provided as separate components. Alternatively, the gate driving circuit is a gate in panel (GIP) type, and may include the level shifter (not shown) formed on the printed circuit board 20 and the shift register (not shown) formed on the curved panel 10.

Figure 2:
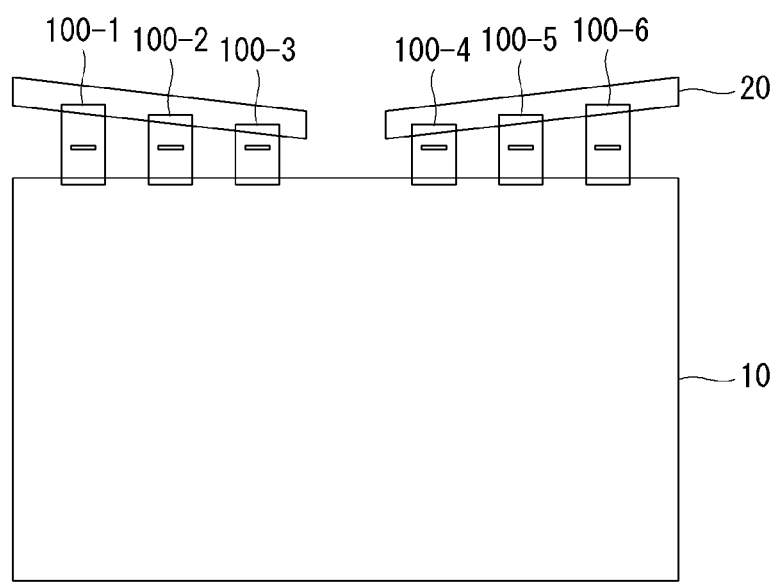
FIG. 2 is a front view of the curved display panel according to one embodiment.

FIG. 2 is a front view of the curved display panel according to one embodiment. In the embodiment of FIG. 3, COFs 100-1, 100-2, and 100-3 have different lengths h1, h2, h3. Length h1 is longest followed by length h2 and length h3 is the shortest. That is, the lengths of COFs increase as they are located further away from the center of the curved panel 10. Lengths of COFs 100-4, 100-5 and 100-5 are set in a similar manner. The lengths of COFs may be in proportion to a curvature angle of the curved panel 10, as described below with reference to FIGS. 4 and 5.

FIGS. 3(a) and 3(b) are diagrams illustrating chip-on films (COF) 100 connecting the curved display panel 10 and printed circuit boards 20 mounted to a backlight unit, according to one embodiment. Referring to FIGS. 3(a) and 3(b), a backlight unit 50 is coupled to a rear surface 12 of the display panel 10. The COFs 100 are attached to a rear surface of the backlight unit 50 through an upper portion of the backlight unit 50. In a first embodiment, the COF 100-1, COF 100-2, and COF 100-3 have different lengths, and thus, variations of distortion of the COF 100-1, COF 100-2, and COF 100-3 in a coupled state may be reduced. Thus, the occurrence of light leakage in a gap between the COFs 100 and the upper portion of the backlight unit 50 may be enhanced. This will be described in more detail as follows.

In order to manufacture the curved panel 10, a flat panel 10-1 as illustrated in FIG. 4(a) is manufactured and subsequently bent through an aging process, or the like. The COFs 100 are attached to the manufactured flat panel 10-1 as illustrated in FIG. 4(*a*).

FIGS. 4(*a*) and 4(*b*) are top views of the flat panel 10-1 and the curved panel 10 with the COFs 100 attached thereto, respectively. As illustrated in FIG. 4(*a*), the attached surfaces 121, 122, and 123 of the COFs 100 attached to the flat panel 10-1 are positioned on the same plane. In contrast, referring to FIG. 4(*b*), attached surfaces 131, 132, and 133 of the COFs attached to the curved panel 10 are not positioned on the same plane. In a state in which the curved panel 10 is formed, the PCB 20-1 is maintained flat, and thus, the COFs 100 connecting the PCB 20-1 and the curved panel 10 are twisted. As a result, a gap is formed between the COFs 100 attached to the rear surface of the curved panel 10 after passing through the upper portion of the curved panel 10 and the upper portion of the curved panel 10, and light leakage occurs from the gap.

When the PCB 20-1 is attached to the curved panel at the inner side, a gap between the PCB 20-1 and the curved panel 10 is largest in the edge of the curved panel 10. Thus, a greater amount of stress is exerted on the COF 100-1, relative to the COF 100-2 and COF 100-3, and light leakage is salient in the region where the COF 100-1 is positioned.

In the first embodiment, the COF 100-1 is formed to be longer than the COF 100-2 and COF 100-3, and thus, less tensile force is exerted on the COF 100-1, relative to the COF 100-2 and the COF 100-3. Therefore, the occurrence of salient light leakage in the region where the COF 100-1 is positioned can be improved.

Figure 5:
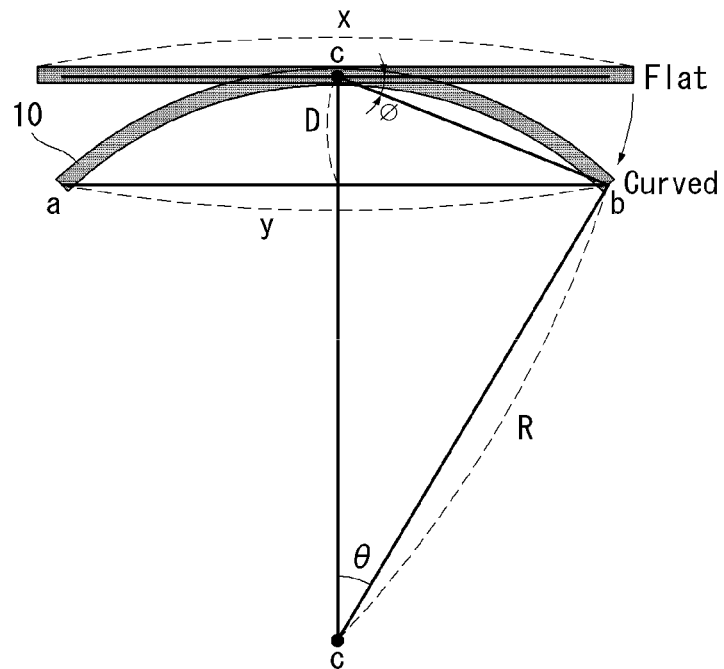
FIG. 5 is a conceptual view illustrating geometric configuration of a curved display panel relative to a flat panel, according to one embodiment.

FIG. 5 is a conceptual view illustrating geometric configuration of a curved display panel 10 relative to a flat panel, according to one embodiment. A virtual horizontal length x refers to a length of curved panel 10 when flattened to have a flat surface. A panel horizontal length y refers to a distance between both end points a and b of the curved panel 10. When the curved panel 10 has a circular arc shape, the radius of curvature R is a distance between center O of a circle (fit to the circular arc shape) and the curved panel 10. A deflection length D refers to a distance between a straight line connecting both ends a and b of the curved panel 10 and the center c of the curved panel. Curvature angle φ is defined as an angle between line b-c and a center plane of flattened version of the display panel.

Figure 6:
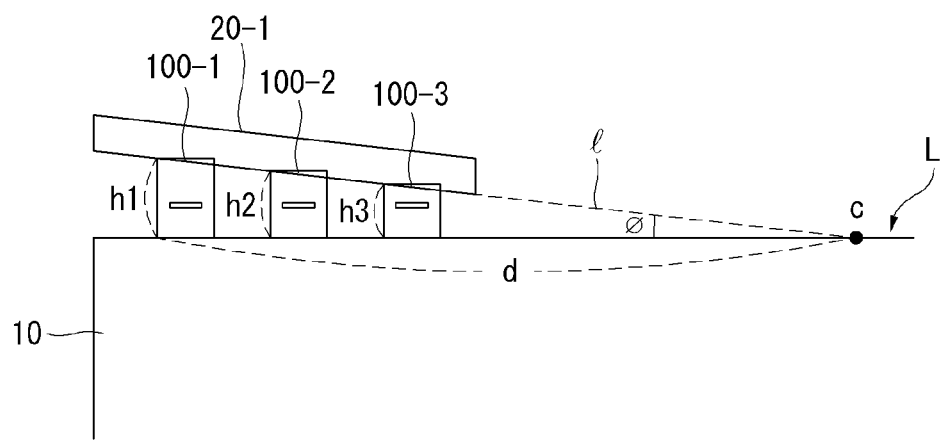
FIG. 6 is a front view showing varying lengths of the COFs connecting the curved display panel and a printed circuit board, according to one embodiment.

FIG. 6 is a front view showing varying lengths h1, h2, h3 of the COFs 100-1 through 100-3 connecting the curved display panel 10 and printed circuit board 20-1, according to one embodiment. In FIG. 5, extension line l of printed circuit board 20-1 indicates a line segment extended from a bottom edge of printed circuit board 20-1. A horizontal line L indicates the upper edge of the curved panel 10. COFs 100-1, 100-2, and 100-3 are attached to the display surface of the curved panel 10 below the horizontal line L.

An angle between extension line l and the horizontal line L of the curved panel 10 corresponds to the curvature angle φ. Accordingly, the distance between the curved panel 10 and the printed circuit board 20-1 in proportion to the distance from center c. The extension line l of the printed circuit board 20-1 meets the panel center c of the curve panel 10. Since the angle between the extension line l and the horizontal line of the curved panel 10 is the curvature angle φ, the length h1 of the COF 100-1 and a distance d between a region of the curved panel 10 bonding to the COF 100-1 and the panel center c the following relationship:

$$h1/d = \tan(\phi) \quad (1)$$

Therefore, the length h1 of the COF 100-1 may be defined as d×tan(φ).

The lengths of COFs 100-2 and 100-3 may be obtained by using Equation (1) but replacing distance d with distances from the center c to regions of the curved panel 10 bonding to the COF 100-2 and COF 100-3, respectively. The lengths of COFs 100-4, 100-5, and 100-6 may also be obtained by using Equation (1) but replacing distance d with distances from the center c to regions of the curved panel 10 bonding to the COF 100-4, COF 100-5 and COF 100-6, respectively.

Tensile stress occurs within COFs as they are bent to bond to the curved panel 10 and the first printed circuit boards 20. The COF 100-1 positioned at the furthest point from the panel center c experiences tensile stress smaller than those of COFs 100-2 and 100-3 because tensile stress applied to the chip-on film is in inverse proportion to an area. Accordingly, the COF 100-1 at the edge of the curved panel 10 is experiences lower tensile stress, preventing light leakage caused by local stress.

Figure 7:
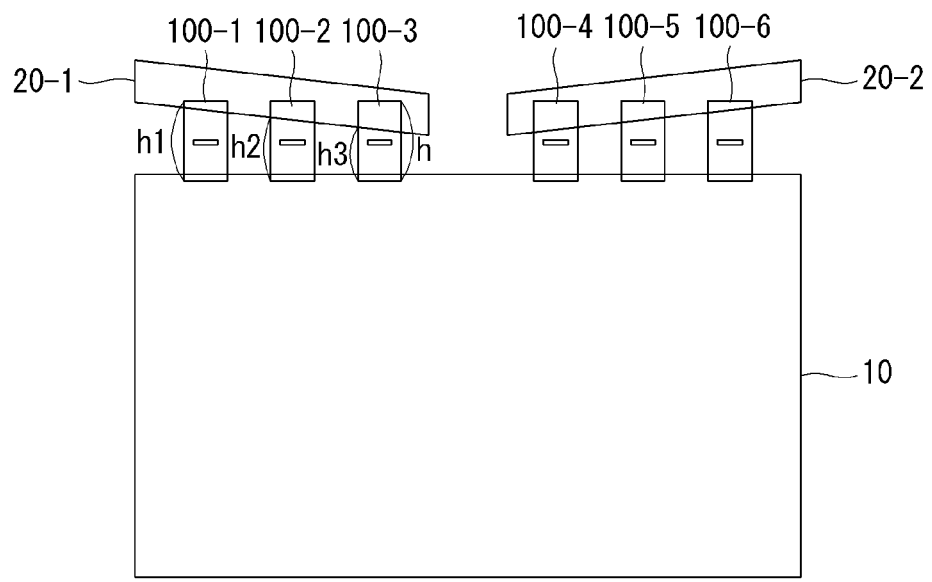
FIG. 7 is a front view showing securing of a printed circuit board to COFs at different locations, according to one embodiment.

FIG. 7 shows a curved display panel 10 according to another exemplary embodiment. The curved display of FIG. 6 includes the curved panel 10, printed circuit boards 20-1 and 20-2, and COFs 600-1 to 600-6. All lengths h of the COFs 600-1 to 600-3 are the same. However, distances z1, z2, and z3 between the curved panel 10 and the printed circuit board 20-1 are set differently. That is, COFs 600-1 through 600-6 are have their end portions bonded to the curved panel 10 but different portions of the COFs 100-1 through 100-6 are bonded to the first printed circuit board 20-1 so that distance z1 is longer than distance z2 and distance z2 is longer than distance z3. Similarly, distance z6 is larger than distance z5 and distance z5 is longer than distance z4. Accordingly, the COFs 100-1, 100-6 experience lower tensile stress than those of the COFs 100-2 through 100-5, and thus local stress occurring on the COFs 100-1 and 100-6 may be reduced.

The local stress on the curved panel 10 may be caused by stress in the COFs. The stress in the COF 100 may be transferred to the curved panel 10, and also cause damage to a wiring pattern formed in the chip-on film 100. FIGS. 8 through 13 show exemplary embodiments where flexibility of the COFs 100 is increased to reduce damage to the COFs. FIGS. 8 through 11 show exemplary embodiments of COFs having slits. A slit herein refers to opening formed in the chip-on film along a predetermined direction.

Figure 8:
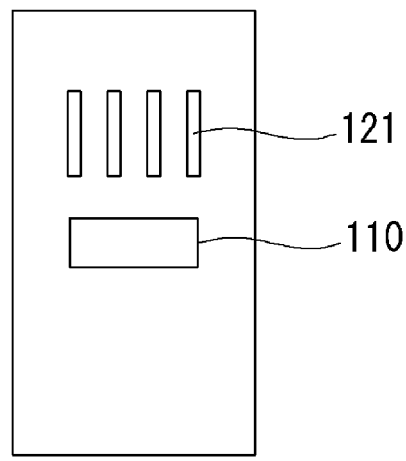
FIGS. 8 through 13 are plan views illustrating COFs of various configurations, according to embodiments.

FIG. 8 is a plan view of COF 101 including vertical slits 121, according to one embodiment. The vertical slits 121 are formed in a region of COF 101 not bonded to the curved panel 10 or the printed circuit board 20. That is, the vertical slits 121 are formed in a region that is bent, and thus flexibility of the chip-on film 101 may be increased.

Figure 9:
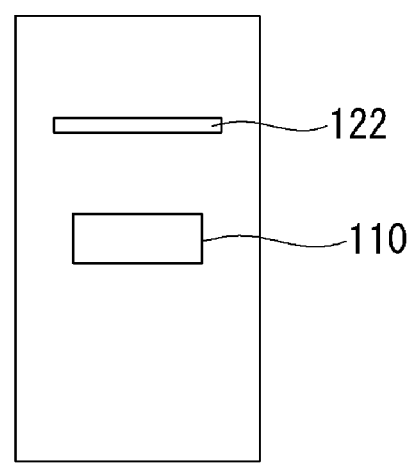

FIG. 9 is a plan view of COF 102 including horizontal slit 122, according to one embodiment. The horizontal slit 122 may be formed in a region way from the source drive IC 110 where COF 102 is bent.

Figure 10:
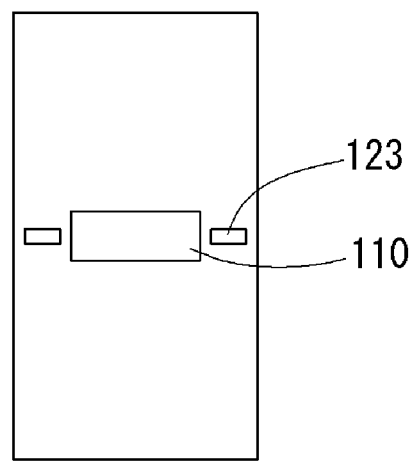

FIG. 10 is a plan view of COF 103 formed with horizontal slits 123 at both sides of the source drive IC 110 in a region where a chip-on film 103 is bent, according to one embodiment.

Figure 11:
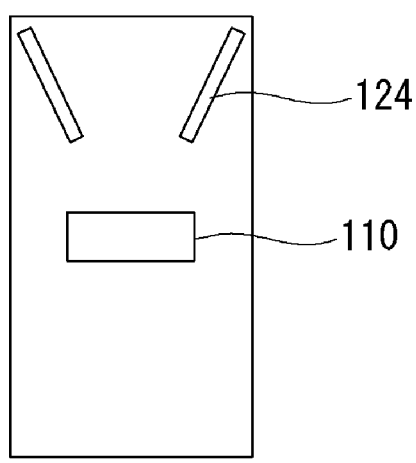

FIG. 11 is a plan view of COF 104 formed with diagonal slits 124, according to one embodiment. The diagonal slits 124 may be formed to slant inward towards the center of the COF 104 from corners of the COF 104. The diagonal slits 124 may be formed to pass through at least a region where the chip-on film 104 is bent.

Figure 12:
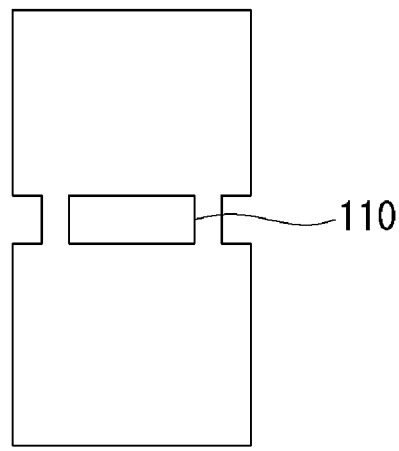
Figure 13:
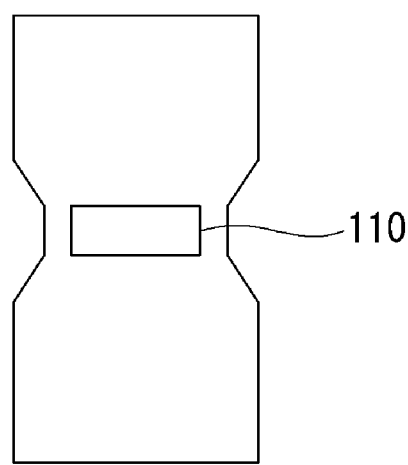

FIGS. 12 and 13 are plan view of COFs 105, 106 having edges indented towards the source drive IC 110, according to embodiments. Specifically, in FIG. 11, both sides of a chip-on film 105 have indents 505 formed perpendicularly towards the source drive IC 110. In FIG. 13, sides of the COF 106 are formed with indents 506 to have slanted lines. In the embodiments of FIGS. 11 and 12, sides of the chip-on film are indented and hence, the widths of the COFs 105, 106 across the center the COFs 105, 106 are smaller than widths at top or bottom ends of the COFs 105, 106.

As described in FIGS. 8 through 13, the flexibility of the COFs is enhanced by forming slits or indents at the sides. Since stress may be effectively dispersed in the COFs, light leakage in the curved panel due to local stress may be prevented or reduced.

Above embodiments are described primarily using COFs. However, the same principle may be applied to a tape carrier package (TCP) or other flexible films.

Although embodiments have been described with reference to a number of illustrative embodiments thereof, it should be understood that numerous other modifications and embodiments can be devised. More particularly, various variations and modifications are possible in the component parts and/or arrangements of the subject combination arrangement within the scope of the disclosure.

What is claimed is:

1. A display device, comprising:
    a curved display panel formed with a pixel array, the curved display panel comprising a curved first surface and a curved second surface opposed to the curved first surface, the first curved surface defined by:
        a first lateral edge,
        a second lateral edge,
        a first curved line connecting one end of the first lateral edge and one end of the second lateral edge, and
        a second curved line connecting another end of the first lateral edge and another end of the second lateral edge;
    a first printed circuit board separate from the curved display panel;
    a first flexible film secured to a first region of the first curved surface and the first printed circuit board to electrically connect the curved display panel to the first printed circuit board, the first region closer to the first lateral edge than the second lateral edge, the first flexible film having a first set length and extending around the first curved line; and
    a second flexible film secured to a second region of the first curved surface and the first printed circuit board, the second region closer to the first lateral edge than the first region, the second flexible film having a second set length longer than the first set length and extending around the first curved line.

2. The display device of claim 1, wherein an integrated circuit is mounted on each of the first and second flexible films.

3. The display device of claim 1, wherein the first curved line is a first arc and the second curved line is a second arc, the first and the second arcs having a same radius of curvature.

4. The display device of claim 3, wherein a ratio of the first set length relative to a distance from a center of the first arc to the first region is same as a ratio of the second set length relative to a distance from the center of the first arc to the second region.

5. The display device of claim 1, wherein the ratio of the first set length relative to the distance from the center of the first arc to the first region corresponds to $\tan(\phi)$ where $\phi$ represents the radius of curvature.

6. The display device of claim 1, further comprising:
    a second printed circuit board separate from the curved display panel and the first printed circuit board;
    a third flexible film secured to a third region of the first curved surface and the second printed circuit board to electrically connect the curved display panel to the second printed circuit board, the third region closer to the second lateral edge than the first lateral edge, the third flexible film having a third set length and extending around the first curved line; and
    a fourth flexible film secured to a fourth region of the first curved surface and the second printed circuit board, the fourth region closer to the second lateral edge than the third region, the fourth flexible film having a fourth set length longer than the third set length and extending around the first curved line.

7. The display device of claim 1, wherein each of the first and second flexible films is rectangular in shape with one or more slits to increase flexibility.

8. The display device of claim 1, wherein each of the first and second flexible films is mounted with an integrated circuit and lateral sides of each of the first and second flexible films is indented towards the integrated circuits.

* * * * *